United States Patent [19]
Ronen

[11] Patent Number: 5,723,987
[45] Date of Patent: Mar. 3, 1998

[54] LEVEL SHIFTING OUTPUT BUFFER WITH P CHANNEL PULLDOWN TRANSISTORS WHICH ARE BYPASSED

[75] Inventor: Stilkol Ronen, Haifa, Israel

[73] Assignee: Intel Corporation, Santa Clara, Calif.

[21] Appl. No.: 660,607

[22] Filed: Jun. 6, 1996

[51] Int. Cl.[6] .............................................. H03K 19/0185
[52] U.S. Cl. ................................ 326/81; 326/63; 326/80
[58] Field of Search ........................... 326/21, 63, 80–81, 326/121

[56] References Cited

U.S. PATENT DOCUMENTS

| | | | |
|---|---|---|---|
| 5,136,190 | 8/1992 | Chern et al. | 326/81 |
| 5,243,236 | 9/1993 | McDaniel | |
| 5,300,832 | 4/1994 | Rogers | |
| 5,311,083 | 5/1994 | Wanlass | 326/81 X |
| 5,321,324 | 6/1994 | Hardee et al. | |
| 5,399,917 | 3/1995 | Allen et al. | |
| 5,510,731 | 4/1996 | Dingwall | 326/63 |
| 5,559,464 | 9/1996 | Orii et al. | 326/80 X |
| 5,570,043 | 10/1996 | Churchill | 326/21 X |
| 5,604,449 | 2/1997 | Erhart et al. | 326/21 X |

*Primary Examiner*—David R. Hudspeth
*Attorney, Agent, or Firm*—Blakely, Sokoloff, Taylor & Zafman

[57] ABSTRACT

An output buffer for providing a 3.3V output from an integrated circuit designed to operate at 2.5V. A bistable level shifting circuit uses p channel pull-up and pull-down transistors where the n-wells of the transistors are coupled to the 3.3V potential. Bypass circuits are used to maintain the set/reset state and to avoid damage to the pull-down transistors. A feedforward path is used to provide biasing protection to a transistor in the output stage during a low-to-high transition.

11 Claims, 4 Drawing Sheets

5,723,987

1

LEVEL SHIFTING OUTPUT BUFFER WITH P CHANNEL PULLDOWN TRANSISTORS WHICH ARE BYPASSED

BACKGROUND OF THE INVENTION

1. Field of the Invention

The invention relates to the field of output buffers particularly for integrated circuits.

2. Prior Art

In some computer systems it is necessary to provide an output signal from an integrated circuit at a higher potential than the potential at which the integrated circuit for the most part operates. For instance, an integrated circuit may operate at 3V and yet be required to provide an output signal of 5V. This requirement can come about where, for example, a new microprocessor replaces an older microprocessor in a computer system.

Generally for integrated circuits, lower voltages enable fabrication of denser circuits which consume less power. An integrated circuit designed to operate at a lower voltage is optimized in several ways for the lower voltage. For metal-oxide-semiconductor (MOS) transistors this typically includes the use of a thinner gate oxide selected for the lower voltage. Often a higher voltage will deteriorate or cause immediate failure. Therefore, care must be taken in designing, for example, an output buffer for a 5 volt bus in an integrated circuit optimized for a 3 volt fabrication process. To accomplish this level shifting circuits are used in conjunction with buffer output stages having circuitry which prevents gate oxides from being exposed to the higher potential. See U.S. Pat. Nos. 5,300,832; 5,399,917; 5,321,324; 5,243,236 and 4,996,443. In some prior art output buffers p channel transistors are formed in n-wells where the n-wells are coupled to the higher potential thereby reducing the voltage across the gate oxide for some conditions.

As will be seen the present invention improves upon the circuitry of the prior art.

SUMMARY OF THE INVENTION

An improvement is described in an integrated circuit which provides an output signal at a first potential where the integrated circuit substantially operates from a second potential which is lower than the first potential. A bistable circuit is used for shifting a signal between approximately the second potential to approximately the first potential. The bistable circuit includes a plurality of p channel pull-down transistors formed in wells where the wells are maintained at approximately the first potential. These pull-down transistors are bypassed at a predetermined voltage.

The output stage driven by the bistable circuit includes two p channel transistors coupled in series with two n channel transistors. A feedforward signal path controlled by a rising data signal is coupled to the gate of one of the p channel transistors to maintain the gate at a predetermined potential in order to protect the gate of the second p channel transistor.

Other details of the present invention will be apparent from the following detailed description.

2

Figure 3:
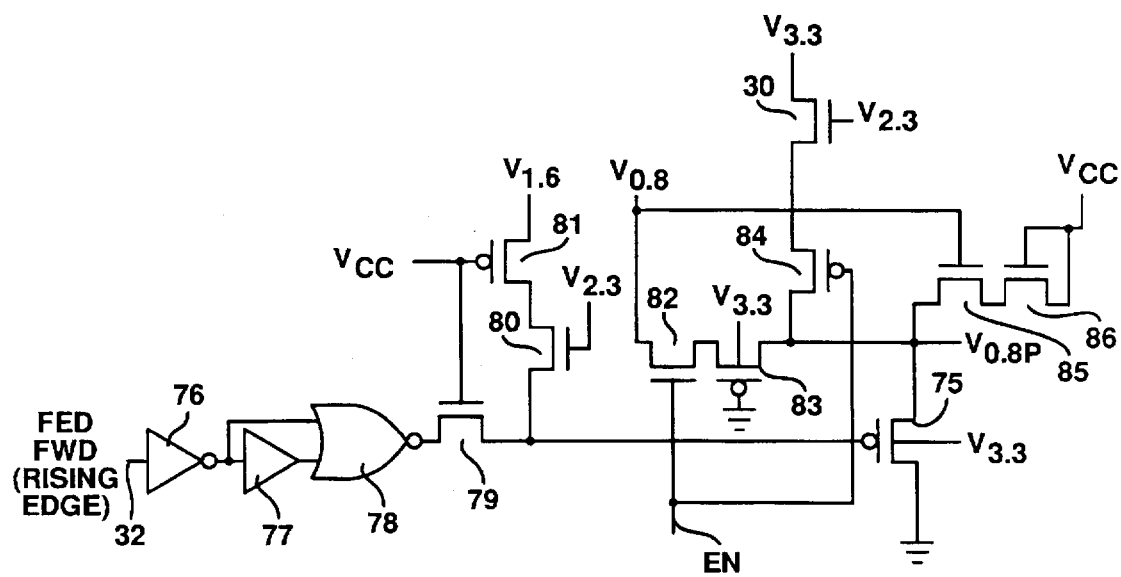

FIG. 3 is an electrical schematic of the feedforward circuitry used in the present invention for providing biasing protection for one of the p channel transistors in the output stage.

Figure 4:
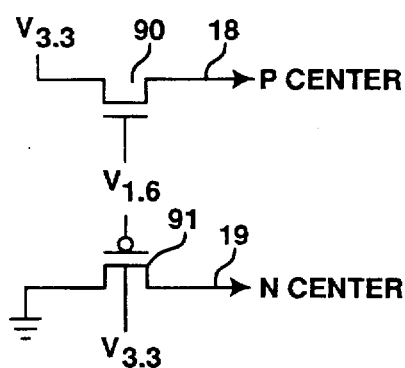

FIG. 4 is an electrical schematic showing center voltages applied to the output stage as used in the present invention.

Figure 5:
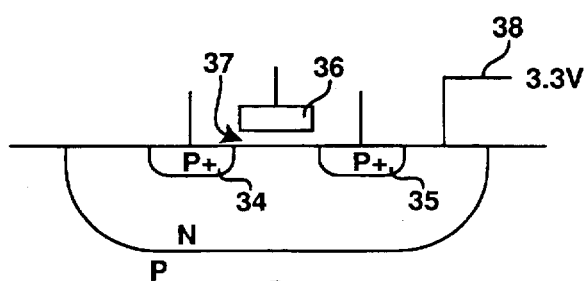

FIG. 5 is a cross sectional elevation view of a p channel transistor illustrating the n-well biasing used for p channel transistors in the present invention.

Figure 6:
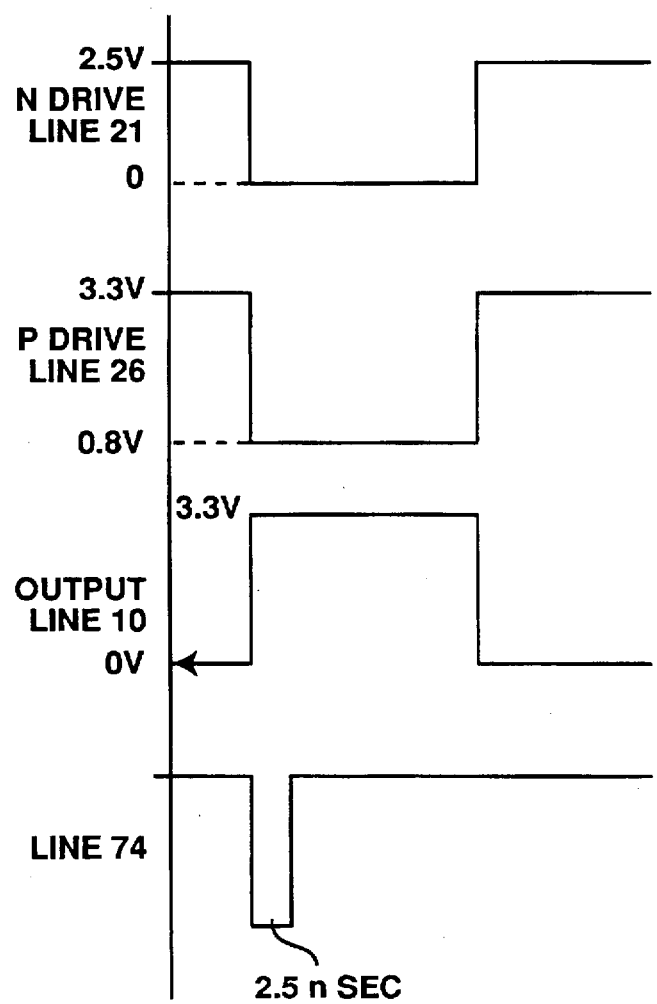

FIG. 6 is a timing diagram used to illustrate signals associated with the feedforward path of FIG. 3.

DETAILED DESCRIPTION OF THE PRESENT INVENTION

An output buffer is described for use in an integrated circuit where the integrated circuit substantially operates at a lower potential than the potential used in the output buffer. In the following description numerous specific details are set forth such as specific voltages, in order to provide a thorough understanding of the present invention. It will be obvious to one skilled in the art that the present invention may be practiced without these specific details. In other instances, well-known circuit techniques have not been described in detail in order not to obscure the present invention.

The present invention may be fabricated using well-known complementary metal-oxide-semiconductor (CMOS) technology.

In one embodiment the integrated circuit which includes the level shifting output buffer of the present invention is fabricated to substantially operate at a potential of 2.5V. (All voltages given below are positive voltages). The output buffer, however, is designed to provide an output signal of 3.3V. This may be particularly useful where a newer microprocessor operating at lower power and higher speeds is fabricated based on 2.5V technology and is replacing an older microprocessor which operated from 3.3V. In order to upgrade a computer system employing the 3.3V microprocessor the 2.5V microprocessor may need to provide output signals of 3.3V to be compatable in the computer system.

Typically where an integrated circuit is designed to operate at a nominal voltage of 2.5V it can withstand higher voltages, for example 2.8V, in order to provide some safety margin. It is of course desirable to maintain this safety margin even in an output buffer designed to provide a higher output potential.

OVERVIEW OF THE PRESENT INVENTION

Figure 1:
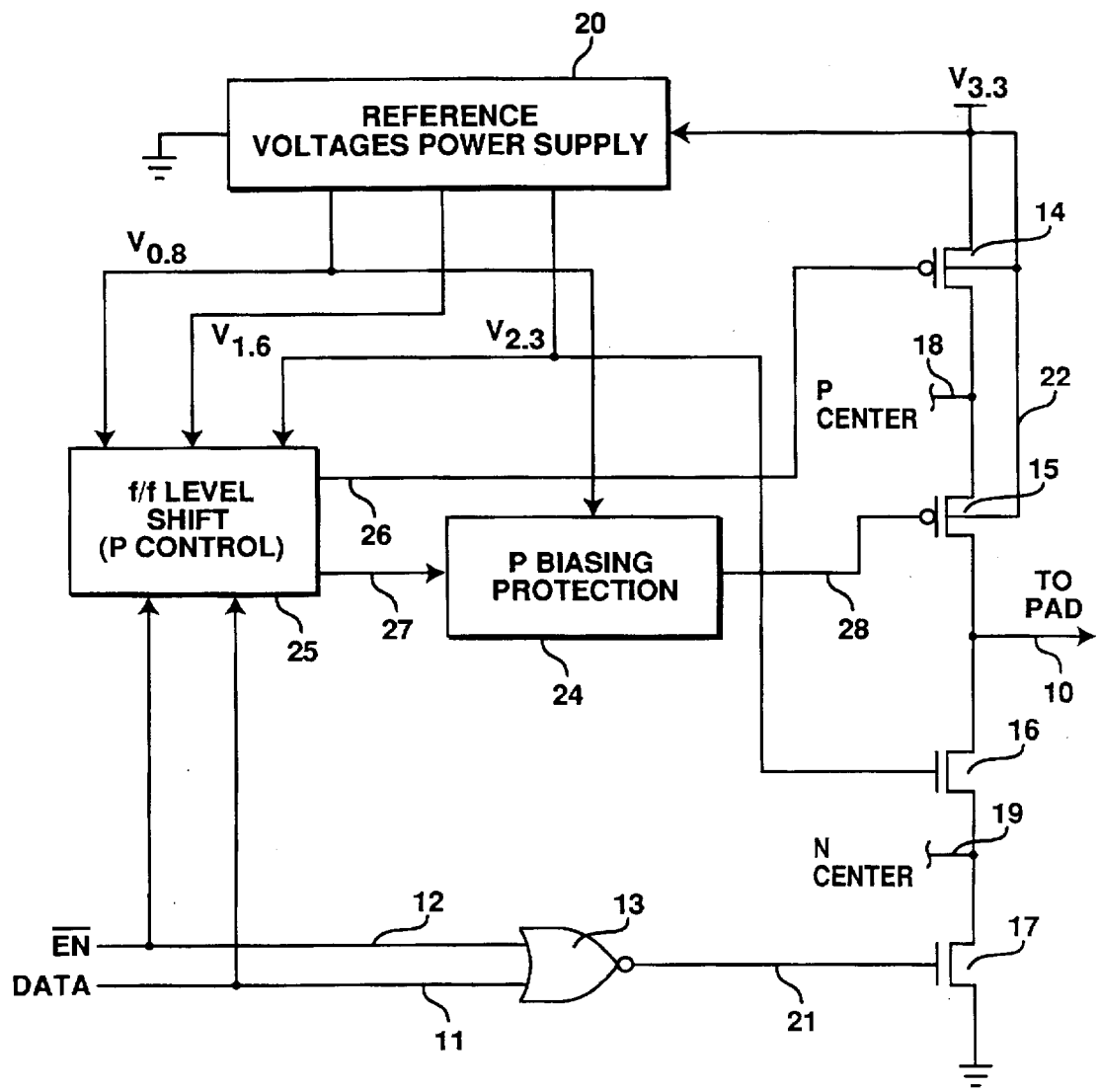
FIG. 1 illustrates the present invention partially in a block diagram and partially in an electrical schematic.

Referring now to FIG. 1 the level shifting output buffer which is fabricated as part of the integrated circuit includes an output line 10 typically connected to a bonding pad on the integrated circuit referred to hereinafter as a terminal. The terminal may be coupled to a bidirectional bus since the buffer of FIG. 1 is a tri-state buffer. When the complement of the enable signal (EN#) on line 12 is low the buffer is enabled and it may output to the terminal 10 either a binary 0 or 1 (i.e., 3.3V or 0V). When EN# is high the buffer is disabled, no signal is sent to the terminal, and the impedance presented by the buffer is high, allowing a signal from the terminal to be sensed at an input buffer incorporated on the integrated circuit.

The final output stage of the buffer of FIG. 1 comprises two p channel transistors 14 and 15 coupled in series with two n channel transistors 16 and 17. The line 10 is connected between the p channel and n channel transistors. The n channel transistor 17 pulls down line 10 to ground whereas the p channel transistor 14 pulls line 10 to the output potential of 3.3V. Transistor 14 has its gate coupled to a bistable (flip-flop) level shifter 25 which is shown in detail in FIG. 2. The node between transistors 14 and 15, node 18 is coupled to the circuit shown in FIG. 4. Similarly, the node between transistors 16 and 17, node 19, is coupled to the circuit of FIG. 4. The gate of transistor 15, line 28, is coupled to a circuit 24 which provides a bias potential. As will be seen this circuit receives a feedforward signal on line 27 which assures that the gate of transistor 15 remains at a predetermined potential when the output line 10 is being pulled up to 3.3V. The gate of the n channel transistor 17 is coupled to the output of a NOR gate 13. This gate receives as inputs the data signal on line 11 and the EN# signal on line 12.

Transistor 15 protects transistor 14 particularly when line 10 is pulled to ground. The gate of this transistor is controlled by the biasing protection circuit 24 which shall be discussed in detail in connection with FIG. 3. The transistor 16 is biased at a potential of 2.3V in order to protect the transistor 17 from the 3.3V when the output of the buffer is high.

For the most part the buffer of FIG. 1 is powered from an externally applied 3.3V power source, whereas, as mentioned, the remainder of the integrated circuit operates on 2.5V. An on chip reference power supply 20 is coupled to receive the 3.3V and provides three potentials used by the output buffer, specifically 0.8V, 1.6V and 2.3V. This circuit may be fabricated using well known circuitry.

Figure 2:
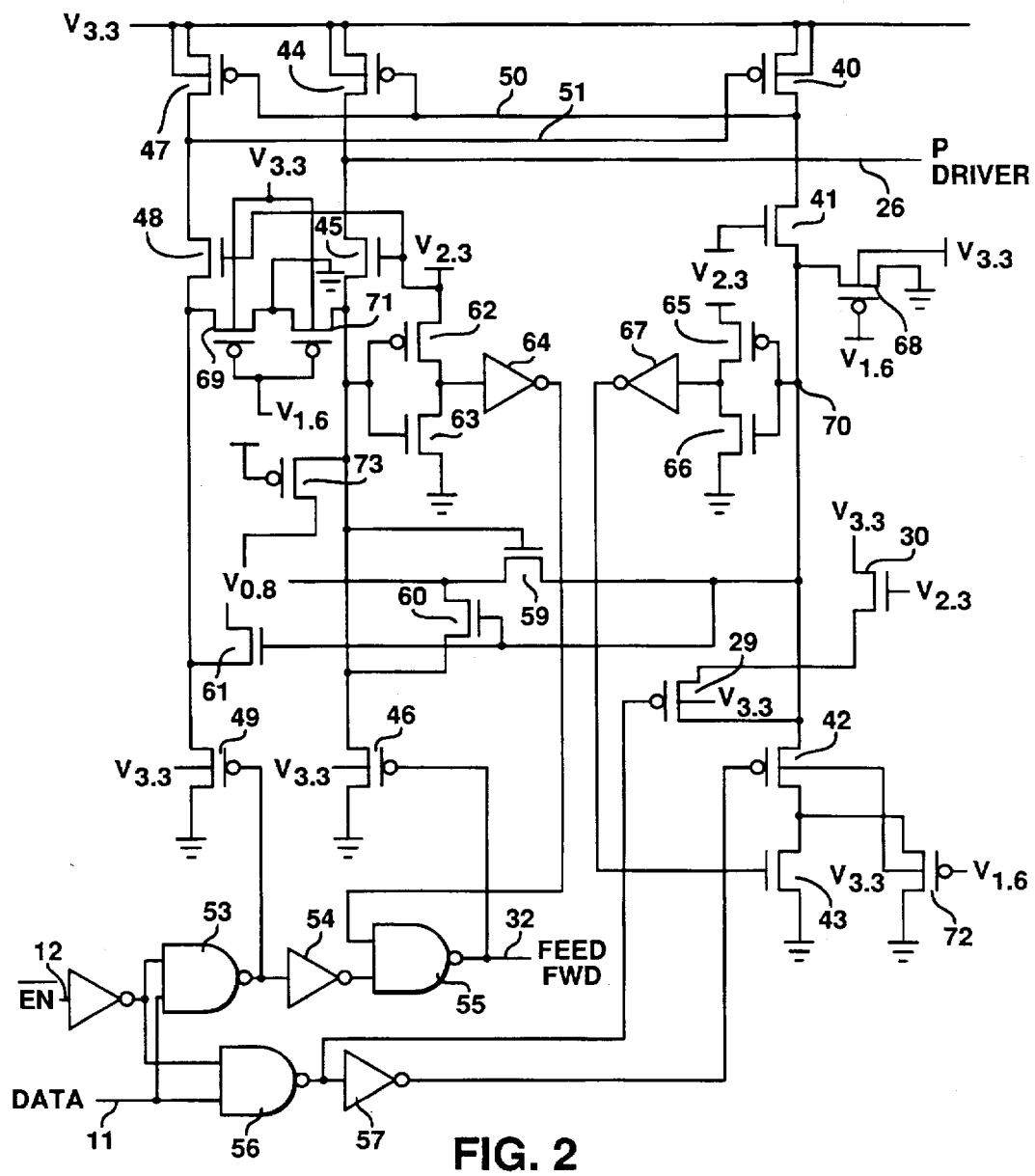
FIG. 2 is an electrical schematic primarily of the bistable level shifter used in the present invention.

The p channel transistors 14 and 15 as well as other p channel transistors in the level shifter of FIG. 2 are fabricated in n-wells which are biased. One such transistor shown in FIG. 5, is formed in a well 33. A pair of spaced apart p-type source and drain regions 34 and 35 are formed in the n-type well 33. The gate 36 which is disposed above and insulated from the channel defined by the source and drain regions is insulated from the substrate by a gate oxide 37. The well is biased at 3.3V as shown in FIG. 5 by the potential applied to the well from line 38. When 3.3V is applied to the gate 36, the gate oxide 37 is subjected to substantially a voltage of 0 since the well 33 is at 3.3V. Note that if the well was not biased the gate oxide would be subjected to a voltage of 3.3V. (The diagram of FIG. 5 is used for purposes of illustration and does not provide, for instance, an accurate depiction of the shape of the source/drain regions, well or connections made to these regions.)

The line 22 of FIG. 1 and similar lines shown in other figures are used to depict that the wells in which the transistors are formed are biased. Specifically, for line 22 of FIG. 1, the well or wells for transistors 14 and 15 are connected to 3.3V.

When the buffer of FIG. 1 is enabled and if the data line 11 is high, (2.5V) the circuit 25 provides a low potential of 0.8V on line 26 causing the line 10 to be pulled up to 3.3V. Since the gate of transistor 15 is at 0.8V, transistor 14 never is subjected to the full 3.3V even when pulling line 10 from 0V. When line 10 is at 3.3V, transistor 17 is not exposed to 3.3V since the gate of transistor 16 is at 2.3V. When the buffer is enabled and the signal on line 11 is low, gate 13 provides a 2.5V signal to transistor 17 pulling down line 10 to 0V. When the buffer is disabled, transistors 14 and 17 do not conduct enabling an input buffer to sense input data.

As can be seen from FIG. 1 the level shifter circuit 25 receives both the EN# and data signals (2.5V signals); circuit 25 provides a 3.3V level signal to line 26 when the data is low or when the buffer is not enabled.

Bistable Level Shifting Circuit

In FIG. 2 the bistable (flip-flop) level shifting circuit 25 of FIG. 1 is shown in detail. This circuit employs p channel transistors both for pulling up and for pulling down.

The circuit of FIG. 2 includes a first branch having a p channel pull-up transistor 40 and a p channel pull-down transistor 42. These transistors are coupled in series through an n channel transistor 41. Transistor 42 is coupled to ground through an n channel transistor 43. The bistable circuit has a pair of second branches, one of these second branches comprises a p channel pull-up transistor 44 coupled in series with a p channel pull-down transistor 46 through an n channel transistor 45. Similarly, the pull-up p channel transistor 47 is coupled in series with the p channel pull-down transistor 49 through the n channel transistor 48. The n channel transistors 41, 45 and 48 which receive 2.3V on their gates protect the p channel pull-down transistors to which they are coupled. Two branches are used on the left side of the bistable circuit to provide more speed of operation; note that the left side of the circuit drives the output line 26.

Cross coupling between the branches is provided through line 50 which couples the gates of transistors 44 and 47 to the drain of transistor 40 and line 51 which couples the gate of transistor 40 to the drain of transistor 47. The driving signal on line 26 for the output stage of the buffer is coupled to the drain of transistor 44. The transistors 40, 42, 44, 46, 47 and 49 are formed in n-wells which are coupled to 3.3V.

The data signal from line 11 and an EN signal from line 12 are coupled to NAND gates 53 and 56. The output of the NAND gate 53 is coupled to the gate of transistor 49 and to the input of an inverter 54. The output of the inverter 54 is coupled through the NAND gate 55 to the gate of the transistor 46. The other input terminal of gate 55 is coupled to the output of an inverter 64 to protect transistor 46 as will be described later. The output of the NAND gate 56 after coupling through an inverter 57 drives the gate of the pull-down transistor 42. The output of the gate 56 is also coupled to a gate of a transistor 29. This transistor helps turn off transistors 44 and 47. Its power is coupled to receive 2.3V less the threshold voltage of transistor 30. Gates 53, 54, 55, 56 and 57 operate from the 2.5V potential used by the integrated circuit which includes the buffer of the present invention.

Transistor 59 protects the transistor 40 and prevents the drain of transistor 40 from being coupled to ground. When transistor 59 conducts (when transistor 44 is pulling up) transistor 40 is coupled to the 0.8V supply. This prevents the transistor 40 from seeing the full 3.3V on its gate oxide. This bypass through transistor 59 thus provides protection for the pull-up transistors. Similarly transistor 60 provides protection for transistor 44 and transistor 61 provides protection for transistor 47. The transistor 60 and 61 conduct when transistor 40 is pulling up. The transistors 59, 60 and 61 assure that the bistable circuit remains set or reset by coupling the pull-up transistors to the 0.8V supply.

An inverter comprising transistors 65 and 66 senses when the potential on node 70 has reached approximately one-half 2.3V and when this occurs causes transistor 43 through an inverter 67 to cease conducting. Similarly, an inverter comprising transistors 62 and 63 and inverter 64 through the gate 55 causes the transistor 46 to cease conducting. After pulling down, transistors 42 and 46 cease conducting. This along with the 0.8V from transistors 59 and 60 assures safe operation and eliminates high resistance nodes.

Transistors 68, 69 and 71 are used to provide leakage from the high resistance nodes to which they are coupled.

Transistor 73 acts as a pull-down in the power-up mode when Vcc=0. Its gate is coupled to receive the Vcc signal. This is used for protection when Vcc=0 and 3.3V is present.

In operation, the circuit of FIG. 2 operates as a true bistable circuit, thus providing the speed advantage of a bistable circuit over a level shifting circuit which is not bistable. The line 26 is pulled in one state to 3.3V by transistor 44. In the other state line 26 is pulled down to 0.8V through the p channel transistor 46 and then clamped through transistor 60 to the 0.8V.

The output of gate 55 provides a signal on line 32 which, as will be seen, provides a feedforward biasing signal used to prevent voltage boot-strapping on the gate of transistor 15 of FIG. 1.

Biasing Protection Circuit of FIG. 3

Referring now to FIG. 3 this circuit assures that the voltage on line 28 applied to the gate of transistor 15 remains stable as the buffer transitions between states. Additionally, when the buffer is disabled the nominal 0.8V which is otherwise maintained on line 28 is replaced with a higher potential (2.3V) less the threshold drop of transistor 30 to enable a higher potential (e.g., 4.3V) to be placed on the line 100 from a computer system bus.

As the output of the buffer transitions from low to high the output of gate 55 of FIG. 2 first drops in potential and then rises in potential because of the signal from the inverter 64. A pulse of approximately 1.5 nsecs occurs. This pulse is coupled on line 32 to an inverter 76 of FIG. 3. The pulse is passed through the amplifier 77 and the NOR gate 78. The NOR gate 78 receives the output of the inverter 76 on both its terminals. Because of the NOR gate 78, the pulse from line 32 is somewhat expanded (from approximately 1.5 nsecs to 2.5 nsecs). The expanded pulse on line 74 is shown in FIG. 6 along with the n channel drive on line 21, the p channel drive on line 26 and the output signal on the line 10.

The pulse from the gate 78 passes through the transistor 79 to the gate of the transistor 75. Transistor 75 is coupled to the line 28, the gate of transistor 15 of FIG. 1. The pulse pulls down line 28 as line 10 is being pulled up. This is done to assure that line 28 remains at approximately 0.8V. Without this, the potential on the gate of transistor 15 would rise because of the bootstrapping effect caused by the capacitance coupling to the gate.

The line 28 is connected to the 2.5V power supply of the integrated circuit through the n channel transistors 85 and 86. The gate of transistor 85 is coupled to 0.8V. Transistors 85 and 86 pull-up line 28 when line 10 is being pulled down by transistor 17 of FIG. 1. This is a passive control of line 28 when the output is transitioning to its low state.

The EN# signal from line 12 is coupled to gates of p channel transistor 84 and n channel transistor 82 through an inverter. When the buffer is enabled, 0.8V is coupled through transistors 82 and 83 to line 28. When the buffer is disabled, transistor 82 cuts off line 28 from the 0.8V supply, and rather line 28 is coupled through transistor 84 to a potential approximately equal to 2.3V less than the threshold voltage drop of transistor 30. This raises the potential on the gate of transistor 15 and enables line 10 to receive a higher potential when the buffer is in its third state without subjecting the gate oxides to a potential of more than 2.3V.

Transistors 80 and 81 receive the 2.5V potential. During power up if the 3.3V potential is present without Vcc, these transistors prevent damage to the circuit of FIG. 3.

P Center and N Center Potentials

The circuit of FIG. 4 provides the potential on line 18 for the node between the p channel transistors of the output stage and the potential on line 19 for the node between the n channel transistors of this stage. Line 18 is coupled to the 3.3V supply through the n channel transistor 90. Line 19 is coupled to ground through the p channel transistor 91. The gates of both these transistors are coupled to 1.6V. Transistor 90 assures that line 18 is maintained at 1.6V less the threshold voltage of transistor 90. If the potential on line 18 drops below this value, transistor 90 conducts. Similarly, the p channel transistor 90 with its gate coupled to the 1.6V potential assures that line 19 does not exceed 1.6V less the threshold voltage of transistor 91. If it does exceed this potential transistor 91 conducts. Both lines 18 and 19 are used to provide additional protection to the transistors in the output stage of the buffer.

Thus, a level shifting output buffer has been described which uses a bistable level shifting circuit in connection with an output stage. The bistable circuit employs p channel transistors both for pull-ups and pull-downs. A feedforward path is used to assure biasing protection in the output stage during transitions.

I claim:

1. In an integrated circuit for providing an output signal at a first potential where the integrated circuit substantially operates from a second potential lower than the first potential, an improvement comprising:
   a bistable circuit for shifting a signal between approximately the second potential to approximately the first potential, the bistable circuit including a plurality of pull-down, p channel transistors formed in wells where the wells are maintained at approximately the first potential, each of the pull-down transistors being bypassed at a predetermined voltage.

2. The improvement defined by claim 1 wherein the bistable circuit includes a plurality of pull-up, p channel transistors coupled to the pull-down transistors, the pull-up transistor being formed in second wells where the second wells are maintained at approximately the first potential.

3. A level shifter circuit comprising:
   a first and a second cross coupled branches;
   the first branch including a first and a second p channel transistor;
   the second branch including a third and a fourth p channel transistor;
   the first and third transistors for pulling up its respective branch to a first potential;
   the second and fourth transistor for pulling down its respective branch;
   the first, second, third and fourth transistors being formed in n-wells, the n-wells being coupled to a potential approximately equal to the first potential; and
   a first bypass circuit for bypassing current around the second transistor as the second transistor pulls down.

4. The level shifter circuit defined by claim 3 including a second bypass circuit for bypassing current around the fourth transistor as the fourth transistor pulls down.

5. The level shifter circuit defined by claim 4 including a first n channel transistor coupled in series between the first and second p channel transistors and a second n channel transistor coupled in series between the third and fourth p channel transistors.

6. The level shifter circuit defined by claim 5 wherein gates of the first and second n channel transistors are coupled to a second potential, the second potential being less than the first potential.

7. An output stage for a buffer coupled to operate from a first potential for providing a data signal on an output node, comprising:

a first p channel transistor and a second p channel transistor coupled in series;

a first n channel transistor and a second n channel transistor coupled in series;

the first and second p channel transistors being coupled in series with the first and second n channel transistors defining the output node;

the buffer being coupled to operate from a first potential;

the first and second p channel transistors being formed in at least one n-well, the n-well being coupled to the first potential; and, a feedforward signal path controlled by a rising data signal coupled to the gate of the second p channel transistor for maintaining the gate at a predetermined potential less than the first potential.

8. The buffer defined by claim 7 wherein the first p channel transistor receives a first data signal for pulling up the output node and wherein the second n channel transistor receives a second data signal for pulling down the output node.

9. The buffer defined by claim 7 wherein the second p channel transistor protects the gate of the first p channel transistor from a low potential on the output node and wherein the first n channel transistor protects the gate of the second n channel transistor from a high potential on the output node.

10. A level shifter circuit comprising:

a first and a second cross coupled branches;

the first branch including a first and a second p channel transistor;

the second branch including a third and a fourth p channel transistor;

the first and third transistors for pulling up its respective branch to a first potential;

the second and fourth transistor for pulling down its respective branch;

the first, second, third and fourth transistors being formed in n-wells, the n-wells being coupled to a potential approximately equal to the first potential; and a first bypass circuit for bypassing current around the second transistor as the second transistory pulls down.

11. The level shifter circuit defined by claim 10 wherein gates of the first and second n channel transistors are coupled to a second potential, the second potential being less than the first potential.

* * * * *